US009689930B2

(12) United States Patent
Hopfgartner (10) Patent No.: US 9,689,930 B2
(45) Date of Patent: Jun. 27, 2017

(54) SINGLE LED FAILURE DETECTION IN A LED CHAIN

(71) Applicant: Infineon Technologies AG, Neubiberg (DE)

(72) Inventor: Herbert Hopfgartner, Lieserbruecke (AT)

(73) Assignee: Infineon Technologies AG, Neubiberg (DE)

( * ) Notice: Subject to any disclaimer, the term of this patent is extended or adjusted under 35 U.S.C. 154(b) by 176 days.

(21) Appl. No.: 14/508,835

(22) Filed: Oct. 7, 2014

(65) Prior Publication Data
US 2016/0097822 A1 Apr. 7, 2016

(51) Int. Cl.
G01R 31/44 (2006.01)
H05B 37/03 (2006.01)
G01R 31/26 (2014.01)

(52) U.S. Cl.
CPC ......... *G01R 31/44* (2013.01); *G01R 31/2635* (2013.01); *H05B 37/03* (2013.01)

(58) Field of Classification Search
CPC .... G01R 31/44; G01R 31/2635; H05B 37/03; H05B 37/036–37/038
USPC ....................................... 324/414
See application file for complete search history.

(56) References Cited

U.S. PATENT DOCUMENTS

| | | | |
|---|---|---|---|
| 3,895,186 A * | 7/1975 | Yoshida | H04N 1/419 358/412 |
| 6,888,454 B2 * | 5/2005 | Kurose | G01R 31/024 324/537 |
| 7,781,983 B1 * | 8/2010 | Yu | H05B 33/0812 315/209 R |
| 8,421,477 B2 * | 4/2013 | Matsuno | G01R 17/02 324/600 |
| 8,878,461 B2 * | 11/2014 | Serebryanov | H05B 37/036 315/291 |
| 9,329,243 B2 * | 5/2016 | Lin | G01R 31/44 |

(Continued)

FOREIGN PATENT DOCUMENTS

AT 102011015282 A1 * 10/2012 ......... H05B 33/0827

OTHER PUBLICATIONS

Theiler, Helmut; "Gesteuerte Versorgungsschaltung" Translation; Oct. 4, 2012; EPO & Google Translate; pp. 24.*

(Continued)

*Primary Examiner* — Melissa Koval
*Assistant Examiner* — Rahul Maini
(74) *Attorney, Agent, or Firm* — Shumaker & Sieffert, P.A.

(57) ABSTRACT

Methods and circuits are described in which an SLS driver circuit includes an SLS driver current source that may be arranged to provide an SLS current to a series SLS chain at a series SLS node. The series SLS chain may include a plurality of SLSs connected in series. The SLS driver circuit also includes a diagnostic current source that is arranged to provide a diagnostic current to a diagnostic resistor at a diagnostic resistor node. The series SLS chain also includes a comparison circuit that may be arranged to compare a series SLS voltage at the series SLS node with a diagnostic voltage at the diagnostic resistor node, and to output a status signal based on a result of the comparison such that the status signal is based, at least in part, on whether a failure condition exists in the series SLS chain.

20 Claims, 7 Drawing Sheets

(56) References Cited

U.S. PATENT DOCUMENTS

2012/0206146 A1*  8/2012  Avenel ................ H05B 37/036
                                                    324/414
2014/0021979 A1*  1/2014  Huang ............... G01R 31/2621
                                                    324/762.09

OTHER PUBLICATIONS

Haefner et al.; LED Diagnosis in Automotive Applications—Application Note; May 2011; OSRAM Opto Semiconductors; All Pages.*

* cited by examiner

SINGLE LED FAILURE DETECTION IN A LED CHAIN

TECHNICAL FIELD

This disclosure relates to electronic circuits, and more specifically to failure detection in chains of light emitting diodes (LEDs) or similar types of loads.

BACKGROUND

Illumination devices (e.g., lamps) that comprise light emitting diodes (LEDs) as luminescent components usually cannot simply be connected to a voltage supply but have to be driven by special driver circuits (or control circuits) providing a defined load current to the LEDs in order to provide a desired radiant power (radiant flux). Since a single LED exhibits only small forward voltages (from about 1.5 V for infrared GaAs LEDs ranging up to 4 V for violet and ultraviolet InGaN LEDs) compared to commonly used supply voltages (for example, 12 V, 24 V and 42 V in automotive applications) several LEDs are connected in series to form so-called LED chains.

In many applications, it is desirable to have a fault detection included in the driver circuits (or control circuits) that allows for detecting defective LEDs in the LED chains connected to the driver circuit. An LED can be regarded as a two-terminal network. A defective LED can manifest in either an open circuit or a short circuit between the two terminals. If one LED of a LED chain fails as an open circuit this is relatively easy to detect because the defective LED interrupts the current for the whole LED chain. If one LED of a LED chain fails as a short circuit, however, only the defective LED stops radiating, which may be more difficult to detect.

SUMMARY

In some examples, the disclosure is directed to methods and circuits in which a semiconductor light source (SLS) driver circuit includes an SLS driver current source. The SLS driver current source is arranged to provide an SLS current to a series SLS chain at a series SLS node. The series SLS chain includes a plurality of SLSs connected in series. The SLS driver circuit also includes a diagnostic current source. The diagnostic current source is arranged to provide a diagnostic current to a diagnostic resistor at a diagnostic resistor node. The SLS driver circuit also includes a comparison circuit that is arranged to perform a comparison to compare a series SLS voltage at the series SLS node with a diagnostic voltage at the diagnostic resistor node, and to output a status signal based on a result of the comparison such that the status signal is based, at least in part, on whether a failure condition exists in the series SLS chain.

In some examples, a device comprises an SLS driver circuit. The SLS driver circuit includes an SLS driver current source that is arranged to provide an SLS current to a series SLS chain at a series SLS node. The series SLS chain includes a plurality of SLSs connected in series. The SLS driver circuit further includes a diagnostic current source that is arranged to provide a diagnostic current to a diagnostic resistor at a diagnostic resistor node. The SLS driver circuit also includes a comparison circuit that is arranged to perform a comparison to compare a series SLS voltage at the series SLS node with a diagnostic voltage at the diagnostic resistor node, and to output a status signal based on a result of the comparison such that the status signal is based, at least in part, on whether a failure condition exists in the series SLS chain.

In some examples, a method comprises providing an SLS current to a series SLS chain at a series SLS node, wherein the series SLS chain includes a plurality of SLSs connected in series. The method may also comprise providing a diagnostic current to a diagnostic resistor at a diagnostic resistor node; performing a comparison to compare a series SLS voltage at the series SLS node with a diagnostic voltage at the diagnostic resistor node, and outputting a status signal based on a result of the comparison such that the status signal is based, at least in part, on whether a failure condition exists in the series SLS chain.

In some examples, a device comprises means for providing an SLS current to a series SLS chain at a series SLS node. The series SLS chain includes a plurality of SLSs connected in series. The device also comprises means for providing a diagnostic current to a diagnostic resistor at a diagnostic resistor node, means for performing a comparison to compare a series SLS voltage at the series SLS node with a diagnostic voltage at the diagnostic resistor node, and means for outputting a status signal based on a result of the comparison such that the status signal is based, at least in part, on whether a failure condition exists in the series SLS chain.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

Non-limiting and non-exhaustive examples of the present disclosure are described with reference to the following drawings.

DETAILED DESCRIPTION

Various examples of this disclosure will be described in detail with reference to the drawings, where like reference numerals represent like parts and assemblies throughout the several views. Reference to various examples does not limit the scope of this disclosure which is limited only by the scope of the claims attached hereto. Additionally, any examples set forth in this specification are not intended to be limiting and merely set forth some of the many possible examples of this disclosure.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," or "in one example," as used herein does not necessarily refer to the same embodiment or example, although it may be the case. Similarly, the phrase "in some embodiments," or "in some examples," as used herein, when used multiple times, does not necessarily refer to the same embodiments or examples, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. Where suitable, the term "gate" is intended to be a generic term covering both "gate" and "base"; the term "source" is intended to be a generic term covering both "source" and "emitter"; and the term "drain" is intended to be a generic term covering both "drain" and "collector." The term "coupled" means at least either a direct electrical connection between the items connected, or an indirect connection through one or more passive or active intermediary devices. The term "signal" means at least one current, voltage, charge, temperature, data, or other signal.

Figure 1:
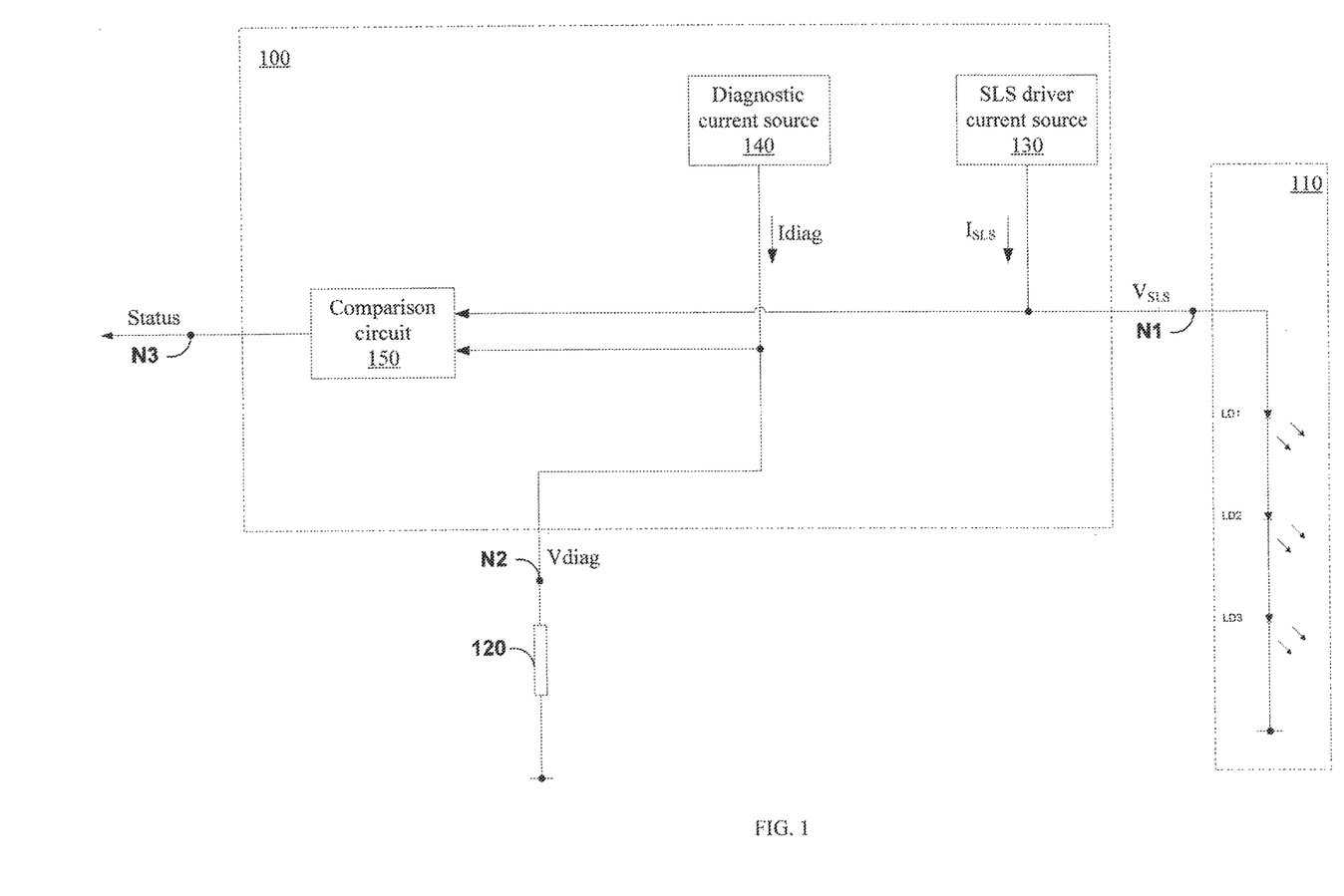
FIG. 1 is a block diagram illustrating an example of a circuit for failure detection for a series SLS chain.

FIG. 1 is a block diagram illustrating an example of a circuit (100) for failure detection for a series semiconductor light source (SLS) chain 110 and diagnostic resistor 120. Circuit 100 includes SLS driver current source 130, diagnostic current source 140, and comparison circuit 150. Series SLS chain 110 includes two or more SLSs coupled in series. In some examples, the SLSs in SLS chain 110 include light-emitting diodes (LEDs), although the disclosure is not so limited, and semiconductor light sources other than LEDs may be employed in some examples. In the specific example illustrated in FIG. 1, series SLS chain 110 includes three SLSs, LD1 through LD3. However, in other examples within the scope and spirit of the disclosure, SLS chain 110 may have some number of SLSs other than three SLSs coupled in series, such as two SLSs coupled in series, or four or more SLSs coupled in series.

SLS driver current source 130 is arranged to provide SLS current $I_{SLS}$ to series SLS chain 110 at node N1. Diagnostic current source 140 is arranged to provide diagnostic current Idiag to diagnostic resistor 120 at node N2.

Comparison circuit 150 is arranged to perform a comparison to compare series SLS voltage VSLS at node N1 with diagnostic voltage VDiag at node N2, and to output signal Status at node N3 based on a result of the comparison such that signal Status is based, at least in part, on whether a failure condition exists in series SLS chain 110.

Diagnostic resistor 120 may be an ohmic resistance having any suitable resistance or a set of ohmic resistances coupled in series and/or in parallel to provide an equivalent resistance so as to provide voltage VDiag at node N2 as a result of receiving diagnostic current Idiag at node N2.

In some examples, voltage VDiag may be provided and defined by a means of providing an external voltage that is different but similar and/or equivalent to an external resistor. The voltage provided by the external source of voltage may also be adjustable for similar reasons stated herein.

Figure 2:
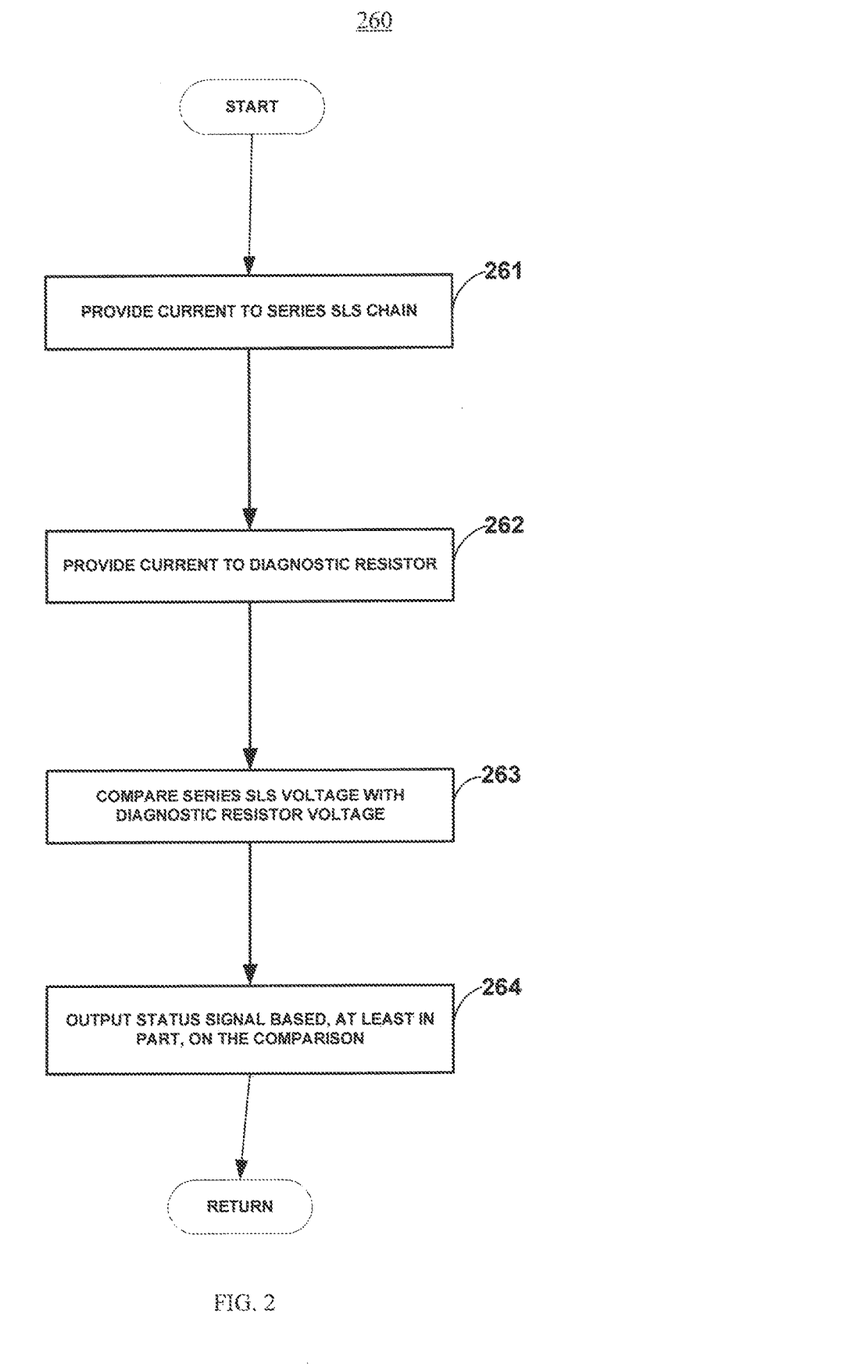
FIG. 2 is a flow diagram illustrating an example of a process for failure detection for a series SLS chain.

FIG. 2 is a flow diagram illustrating an example of a process (260) for failure detection for a series SLS chain. The following is one example of process 260 as performed by circuit 100 of FIG. 1. However, the disclosure is not so limited, and other suitable devices and/or circuits may implement the process of FIG. 2 in other examples within the scope and spirit of the disclosure.

After a start block, SLS driver current source 130 provides SLS current $I_{SLS}$ to series SLS chain 110 at node N1 (261). Diagnostic current source 140 provides diagnostic current Idiag to diagnostic resistor 120 at node N2 (262). (In some examples, as discussed above, voltage VDiag may be provided and defined by a means of providing an external voltage that is different but similar and/or equivalent to an external resistor.) Comparison circuit 150 performs a comparison to compare series SLS voltage VSLS at node N1 with diagnostic voltage VDiag at node N2 (263). Comparison circuit 150 outputs signal Status at node N3 based on a result of the comparison such that signal Status is based, at least in part, on whether a failure condition exists in series SLS chain 110.

Figure 3:
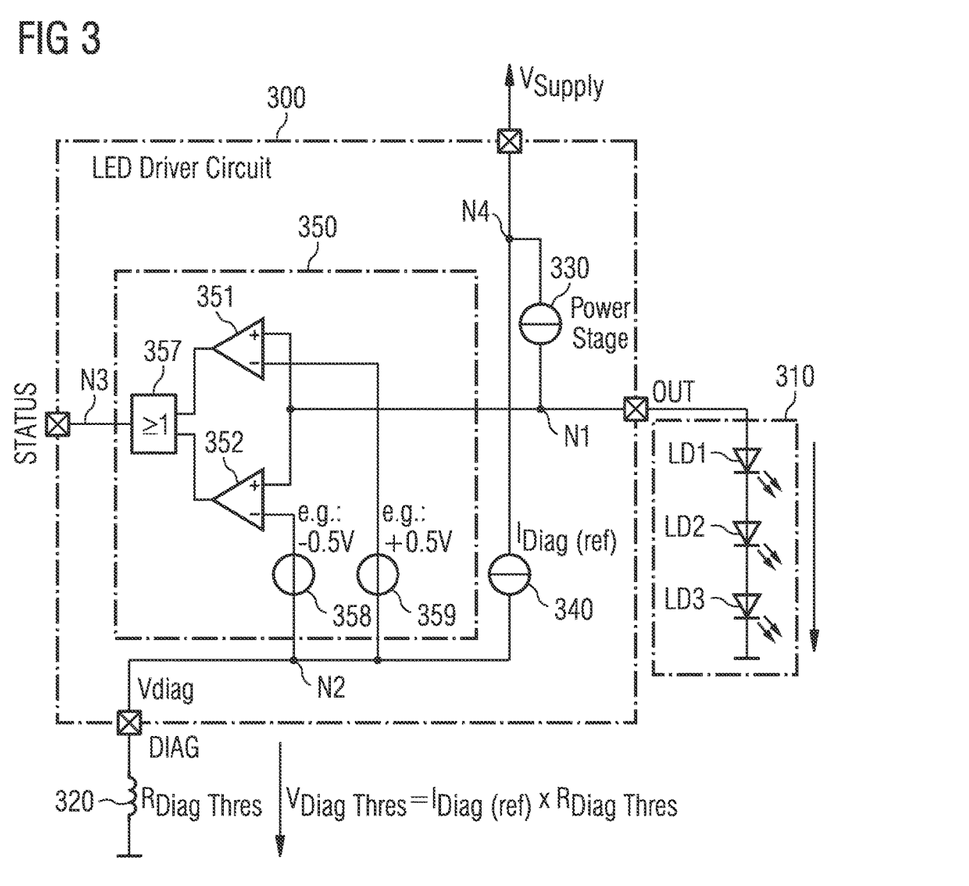
FIG. 3 is a block diagram illustrating an example of the circuit of FIG. 1.

FIG. 3 is a block diagram illustrating an example of circuit 300, which may be employed as an example of circuit 100 of FIG. 1. In the specific example illustrated in FIG. 3, the SLSs are LEDs.

In some examples, resistor 320 is an external low-power resistor. In some examples, LED driver current source 330 is a linear current source. In other examples, LED driver current source 330 is arranged to provide a regulated current to series LED chain 310. For instance, in some examples, LED driver current source 330 includes a DC/DC voltage regulator. In some examples, diagnostic current source 340 is an internal current source that provides a relatively accurate, temperature-independent current, for example, based on a bandgap voltage reference.

In some examples, comparison circuit 350 includes comparator 351, comparator 352, logic block 357, voltage offset block 358, and voltage offset block 359. In some examples, voltage offset block 358 is arranged to provide a first offset voltage (−0.5V in one example), and voltage offset block 359 is arranged to provide a second offset voltage (+0.5V in one example). In some examples, logic block 357 is arranged to output signal Status based on the outputs of comparator 351 and comparator 352. In some examples, logic block 357 consists solely of an OR gate. In other examples, logic block 357 may include other suitable logic in place of and/or in addition to an OR gate.

In some examples, comparator 351 is arranged to provide an output having one logic level if VLED is greater than VDiag+0.5V, and another logic level if VLED is less than VDiag+0.5V, and comparator 352 is arranged to provide an output having a first logic level if VLED is greater than VDiag−0.5V, and another logic level if VLED is less than VDiag−0.5V. In some examples, comparator 351, comparator 352, logic block 357, voltage offset block 358, and logic offset block 359 operate together as a window comparator so that signal Status has a first logic level if VLED is within 0.5V of VDiag. In some examples, circuit 300 has an output pin (OUT) at node N1, a diagnosis pin (DIAG) at node N2, a status pin (STATUS) at node N3, and a power supply pin for the power supply at node N4.

Circuit 300 is arranged to compare the total LED forward voltage VLED with a reference voltage. This reference voltage is defined by resistor 320, which, in some examples, may be selected according to the LED forward voltage binning class of LEDs LD1 through LD3. According to the comparison of VLED with the reference voltage, LED driver circuit 300 can differentiate whether VLED is within or outside of the nominal range. In some examples, the reference voltage is VDiag, and is generated by providing current IDiag to resistor 320.

In some examples, the voltage VDiag represents the typical LED forward voltage of the entire LED chain. Voltage VDiag may be given by Idiag*RDiagThres, where RDiagThres is the resistance or equivalent resistance of resistor 320. In some examples, a suitable resistor 320 may be selected based on series LED chain 310, for example using a different resistor 320 depending on the binning class of the LEDs used in series LED chain 310, the color of the LEDs in the chain, the number of LEDs in the chain, and/or the like. In some examples, resistor 320 may be chosen by calculating a desired resistance for resistor 320 depending on series LED chain 310.

As an example, the typical LED forward voltage of a red LED of a particular binning class may be around 2.2V. Accordingly, in this example, the expected voltage of VLED for the three LEDs LD1-LD3 for this binning class is VLED (expected)=VDiag=2.2V*3=6.6V.

If the IDiag(ref)=100 µA, the resistor can be calculated accordingly as RDiagThres=VDiag/IDiag(ref)=6.6V/100 µA=66 kΩ.

Accordingly, in some examples, the resistor value RDiagThres is defined to be proportional to the expected voltage of series LED chain 310.

Of course, in various examples, RDiagThres may be set separately based on a number of different factors, such as the number of LEDs in series LED chain 310, the expected forward voltage of reach of the LEDs in LED chain 310, the value of the current provided by diagnostic current source 340, and the way in which offset voltages are employed (by, e.g., offset voltage blocks 358 and 359).

During operation, in some examples, the two comparators (351 and 352) compare VLED with VDiag using and an upper and lower margin. In the specific example illustrated in FIG. 3, the margin is ±0.5V. This margin is used to include, e.g., production spread and temperature dependencies.

In some examples, if the measured voltage VLED is outside of the allowed voltage range (VDiag−0.5V)<VLED<(VDiag+0.5V), LED driver circuit 300 provides a diagnosis output as signal Status via the STATUS-pin, so that signal Status provides a diagnosis as to whether a failure condition exists in series LED chain 310. In some examples, signal Status provides a diagnosis not just based on one series LED chain, but series LED chain 310 as well as one or more additional series LED chains (not shown in FIG. 3) driven by LED driver circuit 300. Signal Status can be used for further processing.

In this way, signal Status is asserted when a fault condition (e.g., short circuit or open load condition) exists on any of the LEDs LD1 through LD3, and signal Status is unasserted otherwise. Circuit 300 may be capable of detecting open load conditions and short circuit conditions, including detection of a single short (i.e., detection of a short circuit in just one of the LEDs in series LED chain 310).

Comparison circuit 350 can be employed to determine whether voltage VLED is inside or outside of the allowed voltage range (VDiag−0.5V)<VLED<(VDiag+0.5V). One example of comparison circuit 350 is illustrated in FIG. 3 employing a window comparator with an a positive offset and a comparator for determining whether VLED is above VDiag plus the voltage offset, and a negative offset and a comparator for determining whether VLED is below VDiag minus the negative offset, where VDiag is set to be equal to the expected value of VLED.

However, in other examples, only one offset may need to be employed. For example, VDiag may be set to be substantially equal to be the expected value of VLED−0.5V, with offset block 358 not included, and offset block 359 being set to +1.0V. In other examples, VDiag may be set to substantially equal to the expected value of VLED+0.5V, with offset block 358 not included, and offset block 359 being set to −1.0V. These examples and others are within the scope and spirit of the disclosure.

In some examples of circuit 300, as discussed above, an upper voltage threshold of 0.5V is employed, and a lower threshold of 0.5V is employed. That is, in some examples, comparison circuit 350 is arranged to determine whether VLED is within a window defined by $VLED_{exp}+Vthresh_{upper}$ at the upper end of the window, and defined by $VLED_{exp}-Vthresh_{lower}$ at the lower end of the window. In the specific example discussed above, $Vthresh_{upper}$ is 0.5V and $Vthresh_{lower}$ is 0.5V. These threshold values define an allowable range when applied to the equations above ($VLED_{exp}+Vthresh_{upper}$ and $VLED_{exp}-Vthresh_{lower}$). In this example, the allowable range spans 1.0V. The allowable range provides a tolerance for the LEDs forward voltages, which may change due to a number of factors noted herein (e.g., production spread, temperature, etc.). However, other suitable values for $Vthresh_{upper}$ and $Vthresh_{lower}$ may be employed in other examples, and $Vthresh_{upper}$ and $Vthresh_{lower}$ may be equal to each other (e.g., both equal to 0.5V, as given in the above example) or different from each other in various examples. Accordingly, the allowable range is not limited to being 1.0V, and may be some other value. In some examples of comparison circuit 350, $Vthresh_{upper}$ may be set by offset circuit 359, and $Vthresh_{lower}$ may be set by offset circuit 358.

The forward voltage of an LED depends on the type of LED and the binning class of the LED. It is not generally possible to purchase LEDs belonging to a single binning class except at a relatively great expense. For each part that drives LEDs, all of the LEDs should be from the same binning class; different parts that are the same type of part may be used with LEDs that could belong to any of a variety of different binning classes.

Circuit 300 may be adjustable for LEDs of different colors and different binning classes by using a suitable resistor 320 that corresponds to a resistor 320 have a resistance value RDiagThres corresponding to the LED color and binning class being used, in accordance with the resistance calculations discussed above. In this way, for each binning class, there is a corresponding resistor to use. In some examples, for instance, each binning class may be assigned a corresponding category of resistor, such as, for binning class 3A, resistor S should be used, and so forth.

In some examples, as discussed above, voltage VDiag may be provided and defined by a means of providing an external voltage that is different but similar and/or equivalent to an external resistor. The voltage provided by the external source of voltage may also be adjustable for similar reasons stated herein.

The use of resistor 320, which is external to circuit 300, enables use of an adjustable voltage threshold rather than a fixed diagnostic voltage threshold. The used of a fixed, non-adjustable diagnostic voltage threshold may be undesirable in light of the supply voltage range, the LED forward voltage production spread, and the LED forward voltage temperature characteristics. By using resistor 320, an adjustable voltage threshold is enabled. The voltage threshold can be adjusted by replacing resistor 320 with a different resistor having a different resistor value.

The offsets used for the window comparison may be set based on the worst case values for the forward voltages of the LED, including the worst case temperatures. In addition to considering the worst case temperatures, the diagnostic threshold may also include factors such as, inter alia, aging effects, the effects of Ground shifts, and part variation including in the resistor value of resistor 320.

Circuit 300 shows an example in which series LED chain 310 is coupled between the output pin (OUT) and ground. However, the disclosure is not so limited, and series LED chain 310 may be connected in different ways in different examples. In some examples, series LED chain 310 is instead coupled to the supply voltage, and the series LED voltage VLED is referenced to the supply voltage rather than being reference to ground.

Circuit 300 may be employed in a number of different applications, including automotive applications in some examples. In some examples, a car may use a number of series LED chains for headlights, where each series LED chain has three LEDs coupled in series. There are also numerous other applications for circuit 300 beyond automotive applications, including consumer applications for LEDs and industrial applications for LEDs. The techniques may also be used with other circuit elements that are implemented in a chain, including other types of SLSs arranged in series.

In many applications it may desirable to have a fault detection included in the LED driver circuits that allows for detecting defective LEDs in the LED chains connected to the LED driver circuit. A defective LED may become manifest in either an open circuit or a short circuit between the two terminals of the defective LED. If one LED of an LED chain fails as an open circuit, the defective LED interrupts the current for the whole LED chain, which is relatively easy to detect, for example, by monitoring the load current of the LED chain. If one LED of a LED chain fails as a short circuit, only the defective LED stops radiating and the overall voltage drop across the LED chain decreases by the forward voltage of one LED.

Short circuit detection is more difficult than open circuit detection, and various means of short detection may have various disadvantages associated with them. Moreover, detection of a single LED short circuit condition may be particularly difficult without being accompanied by various disadvantages. LED circuit 300, however, is capable of fault detection, including the detection of a single short, without certain disadvantages that may exist for other means of short circuit detection for series LED chains.

Figure 4:
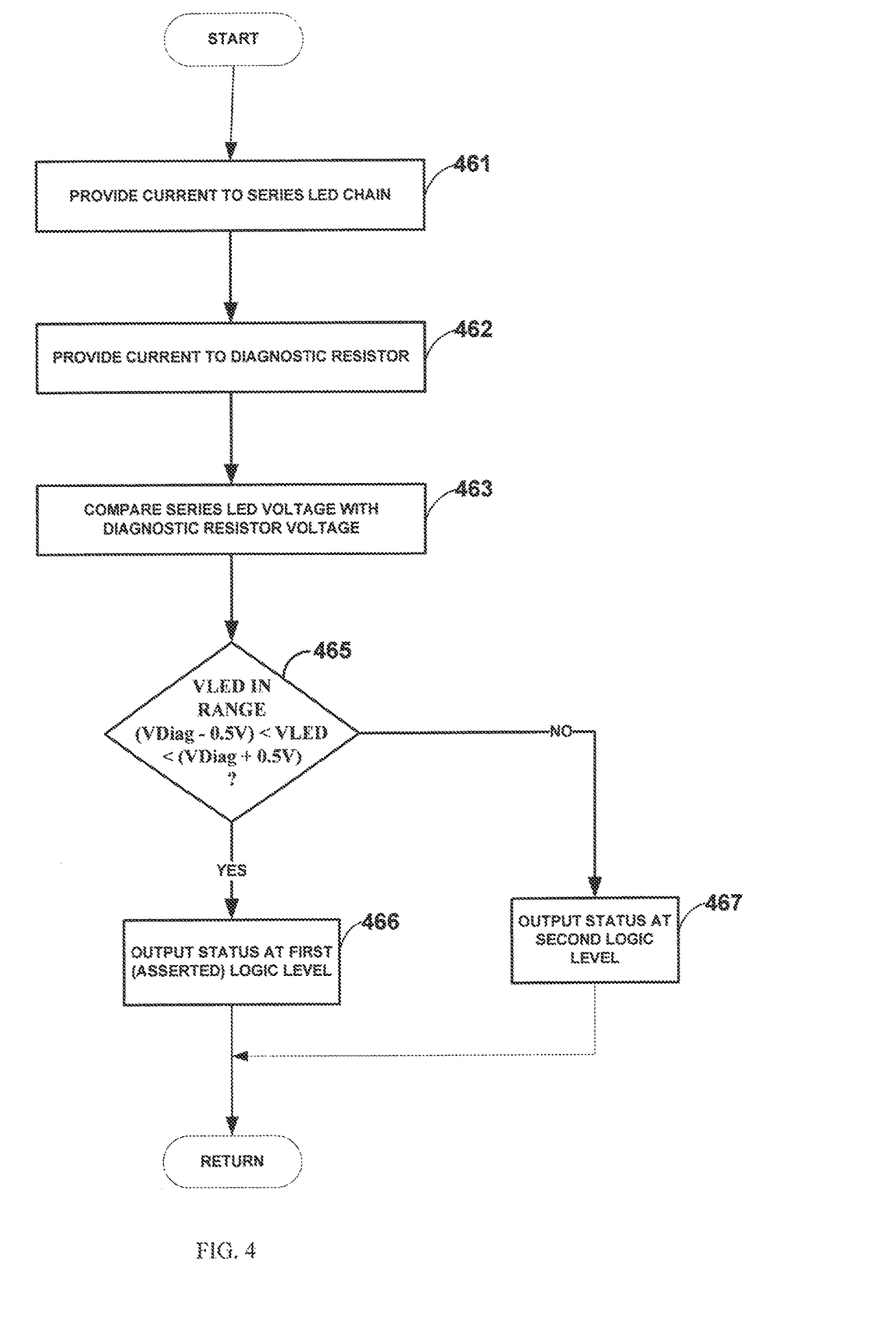
FIG. 4 is a timing diagram illustrating an example of the method of FIG. 2 that is performed by an example of the circuit of FIG. 3.

FIG. 4 is a flow diagram illustrating an example of a process (460) for failure detection for a series LED chain. In some examples, the process of FIG. 4 may be performed by an example of circuit 300 of FIG. 3.

After a start block, LED driver current source 330 provides LED current $I_{LED}$ to series LED chain 310 at node N1 to drive series LED chain 310 (461). Diagnostic current source 340 provides diagnostic current Idiag to diagnostic resistor 320 at node N2 (462). In some examples, comparison circuit 350 makes a determination as to whether voltage VLED is inside the allowed voltage range (VDiag−0.5V)<VLED<(VDiag+0.5V) (465). If so, in these examples, comparison circuit 350 outputs signal Status as a first (i.e., asserted) logic level (466). The process then advances to a return block, where other processing is resumed.

If, however, at decision block 350, comparison circuit 150 determines that voltage VLED is not inside the allowed voltage range (VDiag−0.5V)<VLED<(VDiag+0.5V), comparison circuit 350 output signal Status at a second logic level (467). The process then advances to a return block, where other processing is resumed.

Circuit 300 is an example of an LED driver circuit that is capable of detecting fault conditions including both short circuit conditions (by determining whether VLED is below a particular threshold) and open circuit conditions (by determining whether VLED is above a particular threshold). However, in other examples, circuit 300 may only detect short circuit conditions, and accordingly only need to determine whether VLED is below a particular threshold, and does not need to determine whether VLED is above a particular threshold, as shown with regard to FIG. 5 in one example. In other examples, circuit 300 may only detect open circuit conditions, and accordingly only need to determine whether VLED is above a particular threshold, and does not need to determine whether VLED is below a particular threshold.

Figure 5:
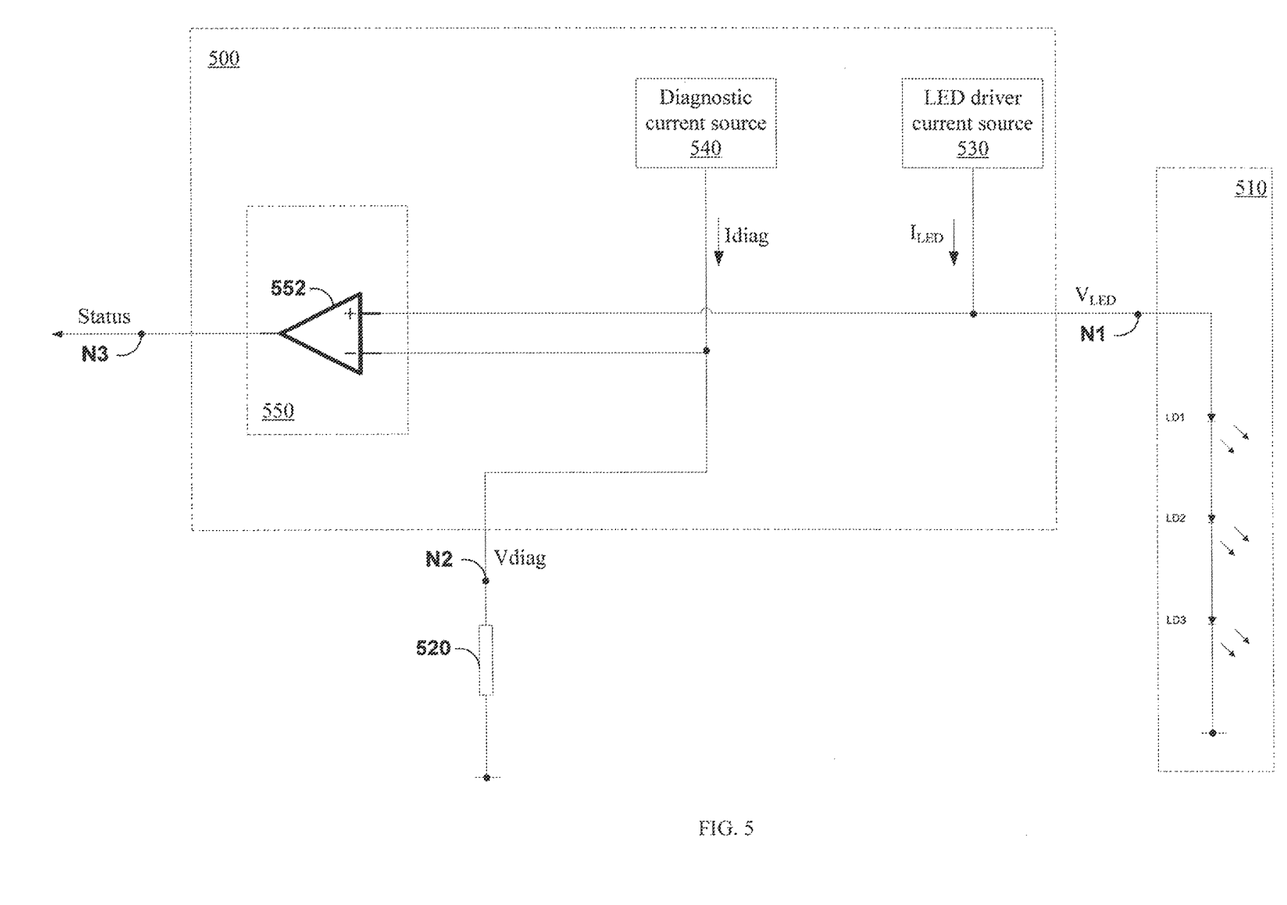
FIG. 5 is a block diagram illustrating another example of the circuit of FIG. 1.

FIG. 5 is a block diagram illustrating an example of circuit 500, which may be employed as an example of circuit 100 of FIG. 1. In circuit 500, comparison circuit 550 includes comparator 552.

Comparison circuit 550 is arranged to determine whether VLED is less than ($VLED_{exp}$−Vthresh), where $VLED_{exp}$ is the expected value of VLED, and Vthresh is voltage threshold to account for factors such as worst case temperature, part variation, aging effects, and/or the effects of Ground shifts. In one example, Vthresh is 0.5V. However, the disclosure is not so limited, and other suitable examples of Vthresh may be employed within the scope and spirit of the disclosure.

In some examples, the resistance of resistor 520 is selected based on $VLED_{exp}$, so that RDiagThres, the resistance of resistor 520, is selected so that $VLED_{exp}$=Idiag*RDiagThres, and comparison circuit 550 includes a voltage offset given by Vthresh so that comparator 552 compares VLED with $VLED_{exp}$−Vthresh.

In other examples, the resistance of resistor 520 is selected so that $VLED_{exp}$−Vthresh=IDiag*RDiagThres, and comparison circuit 520 compares VLED with VDiag.

Various LED driver circuits discussed above, including LED driver circuit 300 of FIG. 3, show examples of driving a series LED chain (e.g., series LED chain 310). However, in some examples, the LED driver circuit (e.g., 300) may drive multiple series LED chains, as shown in accordance with FIG. 6 and FIG. 7 as shown in some examples.

Multiple series LED chains may be used in a variety of different applications. In one example, front and rear headlights of a car may each use a number of LEDs, which may be included as a number of series LED chains. In some examples, each series LED chain may include three LEDs connected in series. However, the disclosure is not so limited, and the LEDs may be organized in other ways in various examples within the scope and spirit of the disclosure. Examples of this disclosure are capable of detecting failure conditions in any of the LEDs, including the detection of a single LED failure, including the detection of a single short condition occurring in any LED of several LED chains driven by a single LED driver circuit.

Figure 6:
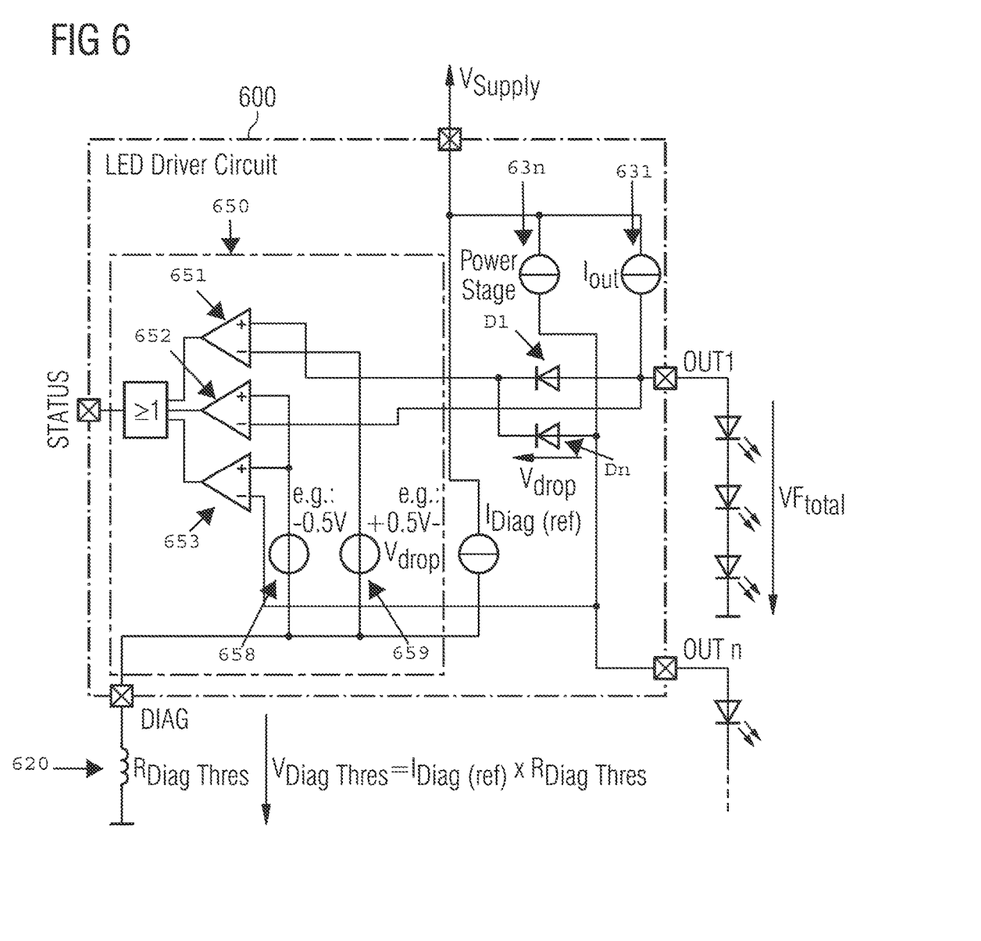
FIG. 6 is a block diagram illustrating an example of the circuit of FIG. 3.

FIG. 6 is a block diagram illustrating an example of circuit 600, which may be employed as an example of circuit 300 of FIG. 3. Circuit 600 drives multiple series LED chains through multiple output pins OUT1 through OUTn, where each series LED chain uses LEDs of the same color and the same binning class. Circuit 600 includes n Led current driver current sources 631 through 63n which each provide a regulated current to a corresponding series LED chain at a corresponding output pin OUT1 through OUTn. Circuit 600 further includes diodes D1 through Dn, one diode for each output pin OUT1 through OUTn.

Because each series LED chain uses LEDs of the same color and the same binning class, resistor 620 is sufficient for the comparison associated with each of the series LED chains.

The cathode of each diode D1 through Dn is coupled the non-inverting input of comparator 651, and the anode of each diode D1 through Dn is coupled to a corresponding output pin OUT1 through OUTn. Diodes D1 through Dn operate to provide the maximum LED series voltage from each of the series LED voltages D1 through Dn (less the forward voltage drop across one of the diodes D1 through Dn). Voltage offset block 659 is arranged to provide a voltage drop of +0.5V−Vdrop to account for the fact that the output to the non-inverting input of comparator 651 is less than the maximum voltage from among the series LED voltages by one forward voltage drop of one of the diodes D1 through Dn. Accordingly, the output of comparator 651 is asserted if any of the series LED voltages exceeds VDiag+0.5V.

There is a corresponding comparator 652, 653, . . . for each output pin OUT1 through OUTn. The non-inverting input of each comparator is coupled to voltage offset block 658, which provides a voltage offset of −0.5V, where voltage offset block 658 is coupled between the DIAG pin and each of the non-inverting inputs of each of the comparators 652, 653, . . . . The inverting input of each of the comparators 652, 653, . . . is coupled to the corresponding output pin OUT1 through OUTn. In this way, each the output of each comparator 652, 653, . . . is asserted when the voltage at the corresponding pin OUT1 through OUTn is less than VDiag−0.5V.

Accordingly, comparison circuit 650 asserts signal Status when there is a fault condition (short condition or open load condition) in any of the LEDs in any of the series LED chains, and is unasserted otherwise.

Figure 7:
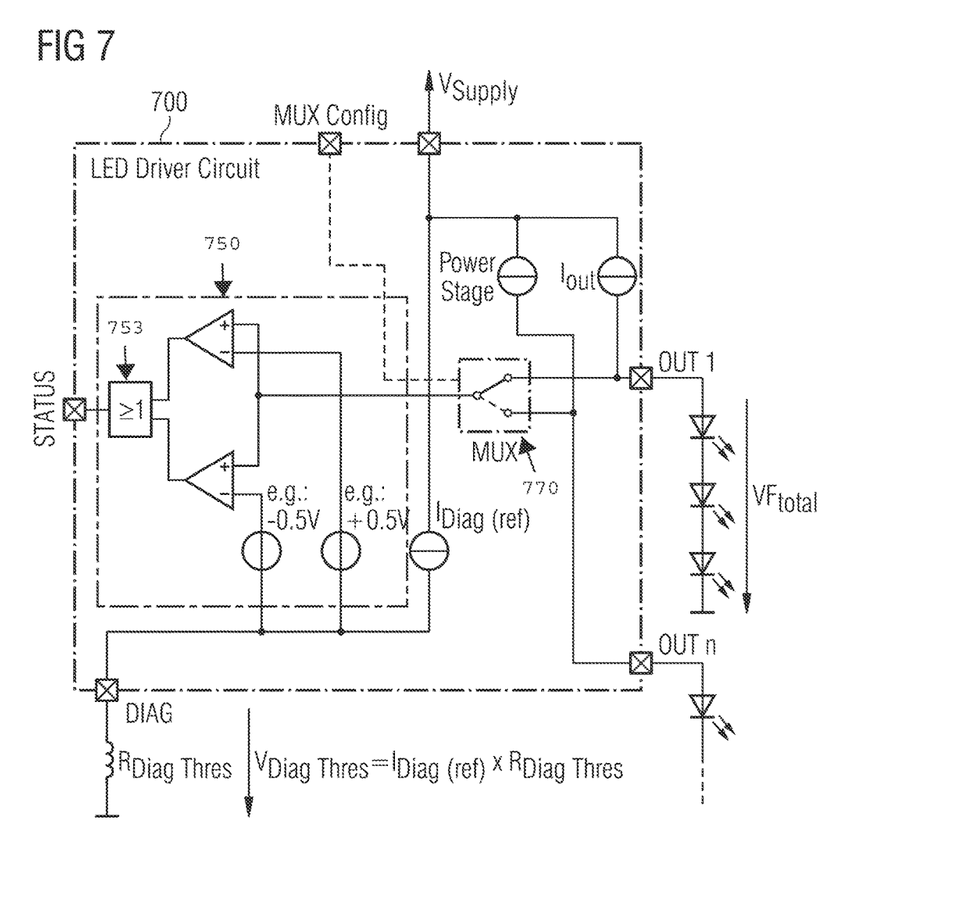
FIG. 7 is a block diagram illustrating another example of the circuit of FIG. 3, in accordance with aspects of the present disclosure.

FIG. 7 is a block diagram illustrating an example of circuit 700, which may be employed as another example of circuit 300 of FIG. 3. Circuit 700 further includes multiplexer 770 and includes a number of output series LED chains, where for each of the series LED chains, in LED circuit 700 there is a corresponding output pin OUT1 through OUTn.

Multiplexer 770 is arranged to multiplex the diagnosis. In various examples, multiplexer 770 may be configured via digital pins or a communication interface such as SPI and/or the like. Multiplexer 770 is employed to time-multiplex the comparisons performed, so that for each series LED chain, a determination may be made as to whether there is a fault in the series LED chain.

For example, multiplexer 770 may be arranged to time-multiplex each of the series LED chains connected to each corresponding output pin OUT1 through OUTn, such that multiplexer 770 provides a current series LED voltage to comparison circuit 750, such that the current series LED voltage varies over time. Comparison circuit 750 is arranged to perform the comparison to compare the current series LED voltage with the VDiag to determine whether a failure condition exists in the current series LED chain.

In some examples, information about each series LED chain may be stored in logic block 753, and logic block 753 may output signal Status based on the stored information. In some examples, logic block 753 outputs signal Status such that signal Status is output at a first logic level if no failure condition is detected on any of the series LED chains, and at a second logic level if a failure condition is detected on any of the series LED chains.

Various examples have been described. For example, circuits are described for detecting failure of a set of loads arranged in series or a chain. The techniques may be employed in a number of different applications, including automotive applications in some examples. As mentioned, for example, a car may use a number of series LED chains for headlights, where each series LED chain has three LEDs coupled in series. There are also numerous other applications for circuits and techniques of this disclosure beyond automotive applications, including consumer applications for LEDs and industrial applications for LEDs. Moreover, the techniques of this disclosure for failure detection of short condition or open load condition may also be used with other circuit elements that are implemented in a chain, including other types of SLSs.

These and other examples are within the scope of the following claims. The above specification, examples, and data provide a description of the manufacture and use of the composition of the disclosure. Since many examples of the disclosure can be made without departing from the scope and spirit of the disclosure, the disclosure also resides in the claims hereinafter appended.

What is claimed is:

1. A device, comprising:
   a semiconductor light source (SLS) driver circuit, including:
   an SLS driver current source that is arranged to provide an SLS current to a series SLS chain at a series SLS node, wherein the series SLS chain includes a plurality of SLSs connected in series, each SLS of the plurality of SLSs being associated with a binning class;
   a diagnostic current source that is arranged to provide a regulated diagnostic current to a diagnostic resistor at a diagnostic resistor node, the diagnostic resistor being external to the SLS driver circuit and defining a resistance that is proportional to a forward voltage corresponding to the binning class, wherein the regulated diagnostic current through the diagnostic resistor generates a diagnostic voltage at the diagnostic resistor node that defines an expected forward voltage for the series SLS chain; and
   a comparison circuit that is arranged to perform a comparison to compare a series SLS voltage at the series SLS node with the expected forward voltage for the series SLS chain, and to output a status signal based on a result of at least the comparison such that the status signal is based, at least in part, on whether a failure condition exists in the series SLS chain.

2. The device of claim 1, wherein the SLS driver circuit is a light-emitting diode (LED) driver circuit, and wherein the series SLS chain is a series LED chain.

3. The device of claim 1, where the SLS driver current source includes a DC/DC voltage regulator.

4. The device of claim 1, wherein the series SLS chain is a first series SLS chain of a plurality of series SLS chains, the SLS driver current source is a first SLS driver current source of a plurality of SLS driver current sources, each driver current source of the plurality of SLS driver current sources is arranged to provide a corresponding SLS current to a corresponding series SLS chain of the plurality of series SLS chains, and
   wherein the comparison circuit is arranged to perform a plurality of comparisons to compare each series SLS voltage of the plurality of series SLS voltages with the expected forward voltage for the series SLS chain, and to output the status signal based on the results of the comparisons such that the status signal is a first logic level when a failure condition exists in any of the series SLS voltages of the plurality of series SLS voltages, and such that the status signal is a second logic level otherwise.

5. The device of claim 1, wherein the series SLS chain is a first series SLS chain of a plurality of series SLS chains, the SLS driver circuit further includes a multiplexer, the multiplexer is arranged to time-multiplex each of the series SLS chains of the plurality of series of SLS chains such that the multiplexer provides a current series SLS voltage to the comparison circuit such that the current series SLS voltage varies over time, and wherein the comparison circuit is arranged to perform the comparison to compare the current series SLS voltage with the expected forward voltage for the series SLS chain to determine whether a failure condition exists in the current series SLS chain.

6. The device of claim 1, wherein the diagnostic current source includes a bandgap voltage reference, and wherein the diagnostic current source is arranged to provide the regulated diagnostic current such that the regulated diagnostic current is a substantially constant, substantially temperature-independent current.

7. The device of claim 1, wherein the comparison circuit includes a window comparator that is arranged to determine whether the series SLS voltage is within a voltage window; and wherein an upper end of the voltage window is the expected forward voltage for the series SLS chain plus an upper voltage threshold, and a lower end of the voltage window is the expected forward voltage for the series SLS chain minus a lower voltage threshold.

8. The device of claim 1, wherein the comparison circuit includes a comparator that is arranged to determine whether the series SLS voltage is less than the expected forward voltage for the series SLS chain minus a voltage threshold.

9. The device of claim 1, wherein the comparison circuit is arranged to output the status signal at a status node, and wherein the comparison circuit includes:

a first comparator having a first input that is coupled to the SLS node, a second input, and an output;

a second comparator having a first input that is coupled to the SLS node, a second input, and an output; and a logic block having a first input that is coupled to the output of the first comparator, a second input that is coupled to the output of the second comparator, and an output that is coupled to the status node.

10. The device of claim 9, wherein the logic block includes an OR gate having a first input that is coupled to the output of the first comparator and a second input that is coupled to the output of the second comparator.

11. The device of claim 9, wherein the comparison circuit further includes:

a first voltage offset circuit that is coupled between the second input of the first comparator and the diagnosis resistor node; and a second voltage offset circuit that is coupled between the second input of the second comparator and the diagnosis resistor node.

12. A method, comprising:

providing a semiconductor light source (SLS) current to a series SLS chain at a series SLS node, wherein the series SLS chain includes a plurality of SLSs connected in series, each SLS of the plurality of SLSs being associated with a binning class;

providing a regulated diagnostic current to a diagnostic resistor at a diagnostic resistor node, the diagnostic resistor defining a resistance that is proportional to a forward voltage corresponding to the binning class, wherein the regulated diagnostic current through the diagnostic resistor generates a diagnostic voltage at the diagnostic resistor node that defines an expected forward voltage for the series SLS chain;

performing a comparison to compare a series SLS voltage at the series SLS node with the expected forward voltage for the series SLS chain; and outputting a status signal based on a result of the comparison such that the status signal is based, at least in part, on whether a failure condition exists in the series SLS chain.

13. The method of claim 12, wherein the SLS current is a light emitting diode (LED) current, the series SLS chain is an LED chain, the series SLS node is a series LED node and the plurality of SLSs include a plurality of LEDs connected in series.

14. The method of claim 12, wherein the series SLS chain is a first series SLS chain of a plurality of series SLS chains, the method further comprising providing current to each of the plurality of series SLS chains, wherein performing the comparison includes performing a plurality of comparisons to compare each series SLS voltage of the plurality of series SLS voltages with the expected forward voltage for the series SLS chain, and wherein outputting the status signal is accomplished such that the status signal is asserted if a failure condition exists in any of the series SLS voltages of the plurality of series SLS voltages.

15. The method of claim 12, wherein the series SLS chain is a first series SLS chain of a plurality of series SLS chains, the method further comprising time-multiplexing each of the series SLS chains of the plurality of series of SLS chains such that a current series SLS voltage is provided for comparison such that the current series SLS voltage varies over time, wherein performing the comparison includes comparing the current series SLS voltage with the expected forward voltage for the series SLS chain to determine whether a failure condition exists in the current series SLS chain.

16. The method of claim 12, wherein performing the comparison includes determining whether the series SLS voltage is within a voltage window such that an upper end of the voltage window is the expected forward voltage for the series SLS chain plus an upper voltage threshold, and a lower end of the voltage window is the expected forward voltage for the series SLS chain minus a lower voltage threshold.

17. The method of claim 16, wherein outputting the status signal includes outputting the signal status at a first logic level when the series SLS voltage is within the voltage window, and outputting the signal status at a second logic level when the series SLS voltage is outside the voltage window.

18. The method of claim 12, wherein performing the comparison includes determining whether the series SLS voltage is less than the expected forward voltage for the series SLS chain minus a voltage threshold.

19. The method of claim 18, wherein outputting the status signal includes outputting the signal status at a first logic level when the series SLS voltage is greater than the expected forward voltage for the series SLS chain minus the voltage threshold, and outputting the status signal at the second logic level when the series SLS voltage is less than the expected forward voltage for the series SLS chain minus the voltage threshold.

20. A device, comprising:
means for providing a semiconductor light source (SLS) current to a series SLS chain at a series SLS node, wherein the series SLS chain includes a plurality of SLSs connected in series, each SLS of the plurality of SLSs being associated with a binning class;
means for providing a regulated diagnostic current to a diagnostic resistor at a diagnostic resistor node, the diagnostic resistor defining a resistance that is proportional to a forward voltage corresponding to the binning class, wherein the regulated diagnostic current through the diagnostic resistor generates a diagnostic voltage at the diagnostic resistor node that defines an expected forward voltage for the series SLS chain;
means for performing a comparison to compare a series SLS voltage at the series SLS node with the expected forward voltage for the series SLS chain; and
means for outputting a status signal based on a result of the comparison such that the status signal is based, at least in part, on whether a failure condition exists in the series SLS chain.

* * * * *